(12) United States Patent
Lu et al.

(10) Patent No.: US 7,998,586 B2
(45) Date of Patent: Aug. 16, 2011

(54) UNDERCOATING LAYERS PROVIDING IMPROVED TOPCOAT FUNCTIONALITY

(75) Inventors: Songwei Lu, Wexford, PA (US);
Caroline S. Harris, Pittsburgh, PA (US);
James McCamy, Export, PA (US); Ilya Koltover, Fox Point, WI (US); Mehran Arbab, Pittsburgh, PA (US); Cheri M. Boykin, Kingsport, TN (US)

(73) Assignee: PPG Industries Ohio, Inc., Cleveland, OH (US)

( * ) Notice: Subject to any disclaimer, the term of this patent is extended or adjusted under 35 U.S.C. 154(b) by 151 days.

(21) Appl. No.: 12/273,617

(22) Filed: Nov. 19, 2008

(65) Prior Publication Data

US 2010/0285290 A1 Nov. 11, 2010

(51) Int. Cl.
*B32B 15/04* (2006.01)
*B32B 17/06* (2006.01)

(52) U.S. Cl. ........ 428/432; 428/469; 428/697; 428/701; 428/702

(58) Field of Classification Search ................. 428/432, 428/469, 472, 472.2, 697, 701, 702
See application file for complete search history.

(56) References Cited

U.S. PATENT DOCUMENTS

| 4,746,347 | A | 5/1988 | Sensi | 65/94 |
| 4,792,536 | A | 12/1988 | Pecoraro et al. | 501/70 |
| 4,853,257 | A | 8/1989 | Henery | 427/166 |
| 4,971,843 | A | 11/1990 | Michelotti et al. | 428/34 |
| 5,030,593 | A | 7/1991 | Heithoff | 501/72 |
| 5,030,594 | A | 7/1991 | Heithoff | 501/72 |
| 5,240,886 | A | 8/1993 | Gulotta et al. | 501/70 |
| 5,385,872 | A | 1/1995 | Gulotta et al. | 501/71 |
| 5,393,593 | A | 2/1995 | Gulotta et al. | 428/220 |
| 5,395,698 | A * | 3/1995 | Neuman et al. | 428/428 |
| 5,464,657 | A | 11/1995 | Athey et al. | 427/255.5 |
| 5,536,718 | A | 7/1996 | Albright et al. | 514/220 |
| 5,599,387 | A | 2/1997 | Neuman et al. | 106/287.14 |
| 5,714,199 | A | 2/1998 | Gerhardinger et al. | 427/195 |
| 6,027,766 | A | 2/2000 | Greenberg et al. | 427/226 |
| 2004/0180218 | A1* | 9/2004 | Nagashima et al. | 428/432 |
| 2004/0202890 | A1* | 10/2004 | Kutilek et al. | 428/689 |
| 2006/0029813 | A1* | 2/2006 | Kutilek et al. | 428/426 |
| 2007/0184291 | A1* | 8/2007 | Harris et al. | 428/469 |

FOREIGN PATENT DOCUMENTS

EP 0 927 706 A2 7/1999

(Continued)

OTHER PUBLICATIONS

"Chemical vapor deposition of $Al_2O_3$ films using highly volatile single sources"; Wonyong Koh, Su-Jin Ku, Yunsoo Kim; Thin Solid Films 304 (1997) 222-224.

(Continued)

*Primary Examiner* — Timothy M Speer
*Assistant Examiner* — Lauren Robinson
(74) *Attorney, Agent, or Firm* — Andrew C. Siminerio

(57) ABSTRACT

A coated article includes a substrate and a first coating formed over at least a portion of the substrate. The first coating includes a mixture of oxides including oxides of at least two of P, Si, Ti, Al and Zr. A functional coating is formed over at least a portion of the first coating. In one embodiment, the functional coating includes fluorine doped tin oxide. In another embodiment, the functional coating includes titania.

11 Claims, 3 Drawing Sheets

FOREIGN PATENT DOCUMENTS

| | | |
|---|---|---|
| EP | 1 056 136 A1 | 11/2000 |
| WO | 2005066286 A1 | 7/2005 |

OTHER PUBLICATIONS

"$Al_2O_3$ thin films from aluminum dimethyl-isopropoxide by metal-organic chemical vapor deposition"; Davide Barreca, Giovanni A. Battiston, Rosalba Gerbasi and Eugenio Tondello; J. Mater. Chem. 10 (2000) 2127-2130.

"Low temperature chemical vapor deposition of aluminosilicate thin films on carbon fibers," Vernal N. Richards, Jason K. Vohs and Bradley D. Fahlman; J. Am. Ceram. Soc. 88 [7] 1973-1976 (2005).

Sodium passivation dependence on phosphorus concentration in tetraethylorthosilicate plasma-enhanced chemical vapor deposited phosphosilicate glasses, J. Kalpathy Cramer, S.P. Murakara, K. V. Srikrishnan, W. Patrick, J. Appl. Phys., 73(5), Mar. 1, 1993, pp. 2458-2461.

R. C. Smith, N. Hoilien, C. Dykstra, S. A. Campbell, J. T. Roberts, and W. L. Gladfelter, "CVD of $Ti_xSi_{1-x}O_2$ films: Precursor chemistry impacts films composition," Chemical Vapor Deposition, 9 (2) (2003) 79-86.

PCT International Search Report, PCT/US2009/064292 dated Feb. 15, 2010.

* cited by examiner

UNDERCOATING LAYERS PROVIDING IMPROVED TOPCOAT FUNCTIONALITY

CROSS-REFERENCE TO RELATED APPLICATIONS

This application is related to U.S. patent application Ser. No. 12/273,623, entitled "Undercoating Layers Providing Improved Conductive Topcoat Functionality", filed concurrently herewith on Nov. 19, 2008, and also U.S. patent application Ser. No. 12/273,641, entitled "Undercoating Layers Providing Improved Photoactive Topcoat Functionality", also filed concurrently herewith on Nov. 19, 2008, both of which applications are herein incorporated by reference in their entirety.

BACKGROUND OF THE INVENTION

1. Field of the Invention

This invention relates generally to coated articles and, in particular, to multi-layer coated articles having a functional topcoat and at least one undercoating layer.

2. Technical Considerations

Articles having multi-layer coatings are used in a wide variety of applications. One example is in the field of thin film solar cells. A typical solar cell comprises a substrate, such as a glass plate, having a transparent conductive film (first electrode). A semiconductor film having a photoelectric conversion material is deposited on the transparent conductive film. The cell includes another substrate having a transparent conductive film (second electrode). An electrolyte could be enclosed between the two electrodes. When the photoelectric conversion material adsorbed on the semiconductor film is irradiated, electrons generated by the irradiation move through the semiconductor film and into one of the transparent conductive films. For example, the electrons can move through the first electrode, through an electrical lead, and to the other electrode. For solar cells, it is important for photoelectric conversion efficiency that the electrons move as rapidly as possible through the first conductive film to the other electrode. That is, it is desirable if the surface resistivity of the transparent conductive film is low. If the electrons do not move rapidly, recombination of the electrons with the photoelectric conversion material (conventionally referred to as "reverse current" or "back current") can occur. It is also desirable if the conductive film is highly transparent to permit the maximum amount of solar radiation to pass to the photoelectric conversion material. Therefore, it would be desirable to provide a coated article for a solar cell that enhances the electron flow through a transparent conductive film. That is, a transparent conductive film having a low surface resistivity.

Another example of a field utilizing coated articles is the field of photocatalytic articles. It is known to apply a photocatalytic coating, such as titania, onto a substrate to provide a coated article having self-cleaning properties. Upon exposure to certain electromagnetic radiation, such as ultraviolet radiation, the photocatalytic coating interacts with organic contaminants on the coating surface to degrade or decompose the organic contaminants. However, conventional photocatalytic articles have a relatively high visible light reflectance and, therefore, can be inappropriate for use in some architectural applications. Additionally, conventional photocatalytic coatings can be subject to degradation through what is conventionally termed "sodium ion poisoning" caused by sodium ions defusing from the underlying glass substrate into the photocatalytic coating. Further, conventional photocatalytic coatings tend to display iridescence effects that detract from the aesthetic appearance of the coated article.

Therefore, it would be desirable to provide a coated article having an undercoating layer positioned between a substrate and a functional top coat (such as but not limited to a conductive photovoltaic transparent conductive coating or a photocatalytic coating) that not only acts as a barrier to sodium ion diffusion but also enhances the performance of the coated article. For example, the performance could be enhanced by decreasing the reflectance of the coated article and/or providing color suppression to the article and/or increasing the functionality of the top coat. For example, in photovoltaic applications, the undercoating layer could decrease the surface resistivity of the top coat (e.g., a transparent conductive layer) to increase electron flow. In photocatalytic applications, the undercoating layer could increase the photocatalytic activity of the photocatalytic coating.

SUMMARY OF THE INVENTION

A coated article includes a substrate and a first coating formed over at least a portion of the substrate. The first coating comprises oxides of at least two of P, Si, Ti, Al and Zr. A functional coating is formed over at least a portion of the first coating. In one non-limiting embodiment, the first coating comprises oxides of Ti and Si. In another non-limiting embodiment, the first coating comprises oxides of Ti, Si and P. In a still further non-limiting embodiment, the first coating comprises oxides of Ti, Si and Al.

Another coated article comprises a glass substrate and a first coating formed over at least a portion of the substrate. The first coating comprises oxides of at least two of P, Si, Ti, Al and Zr. A functional coating is formed over at least a portion of the first coating. The functional coating is selected from titania and fluorine doped tin oxide.

A method of making a coated article comprises providing a glass substrate; forming a first coating over at least a portion of the glass substrate by CVD by directing a first coating composition toward the glass substrate, the first coating composition comprising a silica precursor, a titania precursor, and a silica accelerant comprising at least one accelerant material having at least one of P, Al, and Zr; and forming a functional coating over at least a portion of the first coating by CVD by directing a second coating composition toward the glass substrate, the second coating composition comprising a fluorine doped tin oxide precursor composition or a titania precursor composition.

BRIEF DESCRIPTION OF THE DRAWINGS

A complete understanding of the invention will be obtained from the following description when taken in connection with the accompanying drawing figures.

DESCRIPTION OF THE PREFERRED EMBODIMENTS

Figure 1:
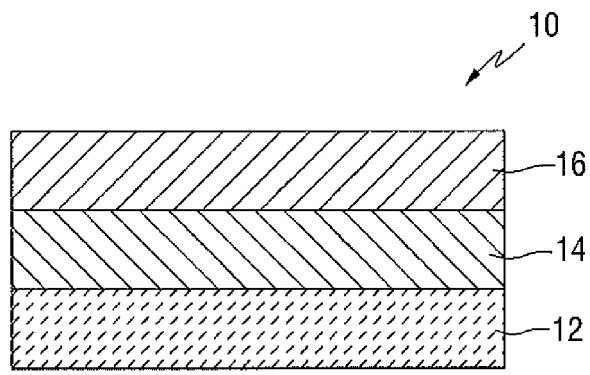
FIG. 1 is a side, sectional view (not to scale) of a coated article incorporating features of the invention.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Further, as used herein, the terms "formed over", "deposited over", or "provided over" mean formed, deposited, or provided on but not necessarily in direct contact with the surface. For example, a coating layer "formed over" a substrate does not preclude the presence of one or more other coating layers or films of the same or different composition located between the formed coating layer and the substrate. As used herein, the terms "polymer" or "polymeric" include oligomers, homopolymers, copolymers, and terpolymers, e.g., polymers formed from two or more types of monomers or polymers. The terms "visible region" or "visible light" refer to electromagnetic radiation having a wavelength in the range of 380 nm to 760 nm. The terms "infrared region" or "infrared radiation" refer to electromagnetic radiation having a wavelength in the range of greater than 760 nm to 100,000 nm. The terms "ultraviolet region" or "ultraviolet radiation" mean electromagnetic energy having a wavelength in the range of 300 nm to less than 380 nm. The terms "microwave region" or "microwave radiation" refer to electromagnetic radiation having a frequency in the range of 300 megahertz to 300 gigahertz. Additionally, all documents, such as but not limited to issued patents and patent applications, referred to herein are to be considered to be "incorporated by reference" in their entirety. In the following discussion, the refractive index values are those for a reference wavelength of 550 nanometers (nm). The term "film" refers to a region of a coating having a desired or selected composition. A "layer" comprises one or more "films". A "coating" or "coating stack" is comprised of one or more "layers".

A coated article 10 incorporating features of the invention is illustrated in FIG. 1. The article 10 includes a substrate 12 having at least one major surface. A first coating (undercoating layer) 14 of the invention is formed over at least a portion of the major surface. A second coating (functional coating) 16 is formed over at least a portion of the first coating 14.

In the broad practice of the invention, the substrate 12 can include any desired material having any desired characteristics. For example, the substrate 12 can be transparent, translucent, or opaque to visible light. By "transparent" is meant having a visible light transmittance of greater than 0% up to 100%. Alternatively, the substrate 12 can be translucent or opaque. By "translucent" is meant allowing electromagnetic energy (e.g., visible light) to pass through but diffusing this energy such that objects on the side opposite the viewer are not clearly visible. By "opaque" is meant having a visible light transmittance of 0%. Examples of suitable materials include, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof); metal substrates, such as but not limited to galvanized steel, stainless steel, and aluminum; ceramic substrates; tile substrates; glass substrates; or mixtures or combinations of any of the above. For example, the substrate can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term "heat treated" means tempered or at least partially tempered. The glass can be of any type, such as conventional float glass, and can be of any composition having any optical properties, e.g., any value of visible transmission, ultraviolet transmission, infrared transmission, and/or total solar energy transmission. By "float glass" is meant glass formed by a conventional float process in which molten glass is deposited onto a molten metal bath and controllably cooled to form a float glass ribbon. Although not limiting to the invention, examples of glass suitable for the substrate are described in U.S. Pat. Nos. 4,746,347; 4,792,536; 5,030,593; 5,030,594; 5,240,886; 5,385,872; and 5,393,593. Non-limiting examples of glass that can be used for the practice of the invention include Solargreen®, Solextra®, GL-20®, GL-35™, Solarbronze®, Starphire®, Solarphire®, Solarphire PV® and Solargray® glass, all commercially available from PPG Industries Inc. of Pittsburgh, Pa. The glass can have a smooth surface or, alternatively, can have a rough or textured surface. In one non-limiting embodiment, the glass surface can have a surface roughness (RMS) in the range of 100 nm to 5 mm.

The substrate 12 can be of any desired dimensions, e.g., length, width, shape, or thickness. For example, the substrate 12 can be planar, curved, or have both planar and curved portions. In one non-limiting embodiment, the substrate 12 can have a thickness in the range of 1 mm to 10 mm, such as 1 mm to 5 mm, such as 2 mm to 4 mm, such as 3 mm to 4 mm.

In one non-limiting embodiment, the substrate 12 can have a high visible light transmission at a reference wavelength of 550 nanometers (nm). By "high visible light transmission" is meant visible light transmission at 550 nm of greater than or equal to 85%, such as greater than or equal to 87%, such as greater than or equal to 90%, such as greater than or equal to 91%, such as greater than or equal to 92%.

The first coating (undercoating layer) 14 provides the coated article 10 with various performance advantages, as will be described in detail below. In one non-limiting embodiment of the invention, the first coating 14 can be a homogeneous coating. By "homogeneous coating" is meant a coating in which the materials are randomly distributed throughout the coating. Alternatively, the first coating 14 can comprise a plurality of coating layers or films, (such as, two or more separate coating films). Alternatively still, the first coating 14 can be a gradient layer. By "gradient layer" is meant a layer having two or more components with the concentration of the components continually changing (or stepped) as the distance from the substrate changes.

In one non-limiting embodiment, the first coating 14 comprises a mixture of two or more oxides selected from oxides of silicon, titanium, aluminum, zirconium and/or phosphorus. The oxides can be present in any desired proportions. In one non-limiting embodiment, the first coating 14 comprises a mixture of silica and titania, with the silica present in the range of 0.1 weight percent (wt. %) to 99.9 wt. % and the titania present in the range of 99.9 wt. % to 0.1 wt. %. The first coating 14 can be a homogeneous coating. Alternatively, the first coating 14 can be a gradient coating with the relative proportions of silica and titania varying through the coating. For example, the first coating 14 can be primarily silica in the region adjacent the substrate surface and primarily titania at the outer region of the first coating 14.

As discussed above, the first coating 14 can include mixtures of at least two oxides having elements selected from silicon, titanium, aluminum, zirconium and/or phosphorus. Such mixtures include, but are not limited to, titania and phosphorous oxide; silica and alumina; titania and alumina; silica and phosphorous oxide; titania and phosphorous oxide; silica and zirconia; titania and zirconia; alumina and zirconia; alumina and phosphorous oxide; zirconia and phosphorous oxide; or any combination of the above materials. The relative proportions of the oxides can be present in any desired amount, such as 0.1 wt. % to 99.9 wt. % of one material and 99.9 wt. % to 0.1 wt. % of the other material.

Additionally, the first coating 14 can include mixtures of at least three oxides, such as but not limited to three or more oxides having elements selected from silicon, titanium, aluminum, zirconium and/or phosphorus. Examples include, but are not limited to, mixtures comprising silica, titania and phosphorous oxide; silica, titania and alumina; and silica, titania and zirconia. In one non-limiting embodiment, the first coating 14 comprises a mixture of silica and titania with at least one other oxide selected from alumina, zirconia, and phosphorous oxide. The relative proportions of the oxides can be present in any desired amount, such as 0.1 wt. % to 99.9 wt. % of one material, 99.9 wt. % to 0.1 wt. % of a second material, and 0.1 wt. % to 99.9 wt. % of a third material.

One particular first coating 14 of the invention comprises a mixture of silica, titania and phosphorous oxide. The silica can be present in the range of 30 volume percent (vol. %) to 80 vol. %. The titania can be present in the range of 5 vol. % to 69 vol. %. The phosphorous oxide can be present in the range of 1 vol. % to 15 vol. %.

The first coating 14 can have any desired thickness, such as but not limited to 10 nm to 120 nm, such as 30 nm to 80 nm, such as 40 nm to 80 nm, such as 30 nm to 70 nm.

The second coating (top coat) 16 comprises a functional coating. Examples of functional coating useful for the invention include, but are not limited to, conductive coatings, solar control coatings, low emissivity coatings, and photoactive coatings.

In one non-limiting embodiment, the second coating 16 comprises at least one conductive oxide layer, such as a doped oxide layer. For example, the second coating 16 can include one or more oxide materials, such as but not limited to one or more oxides of one or more of Zn, Fe, Mn, Al, Ce, Sn, Sb, Hf, Zr, Ni, Zn, Bi, Ti, Co, Cr, Si or In or an alloy of two or more of these materials, such as zinc stannate. The second coating 16 can also include one or more dopant materials, such as but not limited to F, In, Al, and/or Sb. In one non-limiting embodiment, the second coating 16 is a fluorine doped tin oxide coating, with the fluorine present in the coating precursor materials in an amount less than 20 wt. % based on the total weight of the precursor materials, such as less than 15 weight percent, such as less than 13 wt. %, such as less than 10 wt. %, such as less than 5 wt. %. The second coating 16 can be amorphous, crystalline or at least partly crystalline.

In one non-limiting embodiment, the second coating 16 comprises fluorine doped tin oxide having a thickness greater than 200 nm, such as greater than 250 nm, such as greater than 350 nm, such as greater than 380 nm, such as greater than 400 nm, such as greater than 420 nm. In one non-limiting embodiment, the thickness is in the range of 350 nm to 420 nm.

The undercoating layer 14 of the invention provides the top coat 16 (e.g., fluorine doped tin oxide) with a surface resistivity of less than 15 ohms per square ($\Omega/\square$), such as less than 14 $\Omega/\square$, such as less than 13.5 $\Omega/\square$, such as less than 13 $\Omega/\square$, such as less than 12 $\Omega/\square$, such as less than 11 $\Omega/\square$, such as less than 10 $\Omega/\square$.

In another non-limiting embodiment, the second coating 16 can be a photoactive coating. The terms "photoactive" or "photoactively" refer to the photogeneration of a hole-electron pair when illuminated by radiation of a particular frequency, e.g., ultraviolet ("UV") light. The photoactive coating can be photocatalytic, photoactively hydrophilic, or both. By "photocatalytic" is meant a coating having self-cleaning properties, i.e., a coating which, upon exposure to certain electromagnetic radiation, such as UV, interacts with organic contaminants on the coating surface to degrade or decompose the organic contaminants. By "photoactively hydrophilic" is meant a coating for which the contact angle of a water droplet on the coating decreases with time as a result of exposure of the coating to electromagnetic radiation in the photoabsorption band of the material. For example, the contact angle can decrease to a value less than 15°, such as less than 10°, and can become superhydrophilic, e.g., decrease to less than 5°, after sixty minutes of exposure to radiation in the photoabsorption band of the material having an intensity of 24 W/m$^2$ at the coating surface. Although photoactive, the coating may not necessarily be photocatalytic to the extent that it is self-cleaning, i.e., may not be sufficiently photocatalytic to decompose organic material like grime on the coating surface in a reasonable or economically useful period of time. For example, the photocatalytic activity can be less than $4\times10^{-3}$ per centimeter minute (cm$^{-1}$ min$^{-1}$), such as less than $3\times10^{-3}$ cm$^{-1}$ min$^{-1}$, such as less than $2\times10^{-3}$ cm$^{-1}$ min$^{-1}$, such as less than $1\times10^{-3}$ cm$^{-1}$ min$^{-1}$.

The photoactive coating can include at least one photoactive coating material and, optionally, at least one additive or dopant configured to affect the photoactivity of the coating compared to that of the coating without the dopant material. The photoactive coating material can include at least one oxide, such as but not limited to, one or more oxides or oxidesemiconductors, such as titanium oxides, silicon oxides, aluminum oxides, iron oxides, silver oxides, cobalt oxides, chromium oxides, copper oxides, tungsten oxides, zinc oxides, zinc/tin oxides, strontium titanate, and mixtures thereof. The oxide can include oxides, super-oxides or sub-oxides of the element. The oxide can be crystalline or at least partially crystalline. In one exemplary coating of the invention, the photoactive coating material is titanium dioxide (titania). Titanium dioxide exists in an amorphous form and three crystalline forms, i.e., the anatase, rutile and brookite crystalline forms. The anatase phase titanium dioxide is particularly useful because it exhibits strong photoactivity while also possessing excellent resistance to chemical attack and excellent physical durability. However, the rutile phase or combinations of the anatase and/or rutile phases with the brookite and/or amorphous phases are also acceptable for the present invention.

Examples of dopants for the photoactive coating useful for the invention include, but are not limited to, one or more of chromium (Cr), vanadium (V), manganese (Mn), copper (Cu), iron (Fe), magnesium (Mg), scandium (Sc), yttrium (Y), niobium (Nb), molybdenum (Mo), ruthenium (Ru), tungsten (W), silver (Ag), lead (Pb), nickel (Ni), rhenium (Re), tin (Sn), and/or any mixtures or combinations thereof in either the elemental or ionic state.

In one non-limiting embodiment, the second coating 16 comprises titania having a thickness greater than 10 nm, such as greater than 20 nm, such as greater than 30 nm, such as greater than 40 nm, such as greater than 50 nm, such as greater than 60 nm, such as greater than 70 nm, such as greater than 80 nm, such as greater than 90 nm, such as greater than 100 nm, such as in the range of 10 nm to 150 nm.

In one non-limiting embodiment, the first coating 14 of the invention can provide the article 10 having a titania second coating 16 with a reflectance in the visible region of less than 23%, such as less than 20%, such as less than 19%, such as less than 18%, such as less than 17%, such as less than 16%, such as less than 15%, such as less than 14%, such as less than 12%, such as less than 11%, such as less than 10%.

The first coating 14 and/or second coating 16 can be formed over at least a portion of the substrate 12 by any conventional method, such as but not limited to spray pyrolysis, chemical vapor deposition (CVD), or magnetron sputtered vacuum deposition (MSVD). In the spray pyrolysis method, an organic or metal-containing precursor composition having one or more oxide precursor materials, e.g., precursor materials for titania and/or silica and/or alumina and/or phosphorous oxide and/or zirconia, is carried in a suspension, e.g., an aqueous or non-aqueous solution, and is directed toward the surface of the substrate while the substrate is at a temperature high enough to cause the precursor composition to decompose and form a coating on the substrate. The composition can include one or more dopant materials. In a CVD method, a precursor composition is carried in a carrier gas, e.g., nitrogen gas, and is directed toward the heated substrate. In the MSVD method, one or more metal-containing cathode targets are sputtered under reduced pressure in an inert or oxygen-containing atmosphere to deposit a sputter coating over substrate. The substrate can be heated during or after coating to cause crystallization of the sputtered coating to form the coating.

In one non-limiting practice of the invention, one or more CVD coating apparatus can be employed at one or more positions in a conventional float glass ribbon manufacturing process. For example, CVD coating apparatus may be employed as the float glass ribbon travels through the tin bath, after it exits the tin bath, before it enters the annealing lehr, as it travels through the annealing lehr, or after it exits the annealing lehr. Because the CVD method can coat a moving float glass ribbon, yet withstand the harsh environments associated with manufacturing the float glass ribbon, the CVD method is particularly well suited to deposit coatings on the float glass ribbon in the molten tin bath. U.S. Pat. Nos. 4,853,257; 4,971,843; 5,536,718; 5,464,657; 5,714,199; and 5,599,387 describe CVD coating apparatus and methods that can be used in the practice of the invention to coat a float glass ribbon in a molten tin bath.

In one non-limiting embodiment, one or more CVD coaters can be located in the tin bath above the molten tin pool. As the float glass ribbon moves through the tin bath, the vaporized precursor composition can be added to a carrier gas and directed onto the top surface of the ribbon. The precursor composition decomposes to form a coating (e.g., first coating 14 and/or second coating 16) on the ribbon. In one non-limiting embodiment, the coating composition is deposited on the ribbon at a location in which the temperature of the ribbon is less than 1300° F. (704° C.), such as less than 1250° F. (677° C.), such as less than 1200° F. (649° C.), such as less than 1190° F. (643° C.), such as less than 1150° F. (621° C.), such as less than 1130° F. (610° C.), such as in the range of 1190° F. to 1200° F. (643° C. to 649° C.). This is particularly useful in depositing a second coating 16 (e.g., fluorine doped tin oxide) having reduced surface resistivity since the lower the deposition temperature, the lower will be the resultant surface resistivity.

For example, to form a first coating 14 comprising silica and titania, the composition comprises both a silica precursor and a titania precursor. One non-limiting example of a silica precursor is tetraethylorthosilicate (TEOS).

Examples of titania precursors include, but are not limited to, oxides, sub-oxides, or super-oxides of titanium. In one embodiment, the titania precursor material can include one or more titanium alkoxides, such as but not limited to titanium methoxide, ethoxide, propoxide, butoxide, and the like; or isomers thereof, e.g., titanium isopropoxide, tetraethoxide, and the like. Exemplary precursor materials suitable for the practice of the invention include, but are not limited to, tetraisopropyltitanate (TPT). Alternatively, the titania precursor material can be titanium tetrachloride. Examples of alumina precursors include, but are not limited to, dimethylaluminumisopropoxide (DMAP) and aluminum tri-sec-butoxide (ATSB). In one non-limiting embodiment, the dimethylaluminumisopropoxide can be made by mixing trimethylaluminum and aluminumisopropoxide at a molar ratio of 2:1 in an inert atmosphere at room temperature. Examples of phosphorous oxide precursors include, but are not limited to, triethyl phosphite. Examples of zirconia precursors include, but are not limited to, zirconium alkoxides.

A first coating 14 having a combination of silica and titania provides advantages over previous oxide combinations. For example, the combination of a low refractive index material such as silica (refractive index of 1.5 at 550 nm) with a high refractive index material such as titania (refractive index of 2.4 at 550 nm) allows the refractive index of the first coating 14 to be varied between these two extremes by varying the amount of silica and titania. This is particularly useful in providing the first coating 14 with color or iridescence suppression properties.

However, the deposition rate of titania is typically much faster than that of silica. Under typical deposition conditions, this limits the amount of silica to no more than about 50 wt. %, which in turn limits the lower range of the refractive index of the resultant silica/titania coating. Therefore, a dopant material can be added to the silica and titania precursor composition to accelerate the deposition rate of silica. The dopant forms part of the resultant oxide mixture and, therefore, can be selected to provide enhanced performance properties to the resultant coating. Examples of dopants useful for the practice of the invention include, but are not limited to, materials containing one or more of phosphorous, aluminum and zirconium to form oxides of these materials in the resultant coating. Examples of phosphorous oxide precursor materials include triethylphosphite. Examples of alumina precursor materials include aluminumtrisecbutoxide (ATSB) and dimethylaluminumisopropoxide (DMAP). Examples of zirconia precursors include zirconium alkoxide.

EXAMPLES

Example 1

This Example illustrates the use of an undercoating layer of the invention as a color suppression layer for a titania top coat. The undercoating layer was a combination of silica, titania and phosphorous oxide.

The undercoating layer was deposited on a glass substrate by a chemical vapor deposition process using a laboratory coater. A titania coating was then deposited on the undercoating. Table 1 shows the coating configurations (composition and thickness) for Samples 1-4. The undercoating was deposited as a multi-film layer having three undercoating films; a first undercoating film over the glass substrate, a second undercoating film over the first undercoating film, and a third undercoating film over the second undercoating film. The multi-layer configuration simulates a graded undercoating layer.

TABLE 1

|  | Smpl. 1 | Smpl. 2 | Smpl. 3 | Smpl. 4 |
|---|---|---|---|---|
| Thickness of the first undercoating [nm] | 13 | 11 | 29 | 13 |
| Volume % Phosphorus oxide in the first undercoating | 5 | 10 | 5 | 5 |
| Volume % Silica in the first undercoating | 75 | 80 | 70 | 75 |
| Volume % Titania in the first undercoating | 20 | 10 | 25 | 20 |
| Thickness of the second undercoating [nm] | 23 | 33 | 21 | 27 |
| Volume % Phosphorus oxide in the second undercoating | 2 | 2 | 2 | 2 |
| Volume % Silica in the second undercoating | 49 | 58 | 48 | 62 |
| Volume % Titania in the second undercoating | 49 | 40 | 50 | 36 |
| Thickness of the third undercoating [nm] | 21 | 18 | 15 | 23 |
| Volume % Phosphorus oxide in the third undercoating | 5 | 11 | 5 | 5 |
| Volume % Silica in the third undercoating | 75 | 80 | 70 | 70 |
| Volume % Titania in the third undercoating | 20 | 9 | 25 | 25 |
| Thickness of top titania coating [nm] | 115 | 121 | 113 | 118 |

Table 2 shows the reflected color performance data for Samples 1-4 and Comparative Samples (titania coated glass sheets without the undercoating layer). The color data was modeled using conventional TFCalc® software for the coated side of the substrate at D65, 10° Observer.

TABLE 2

|  | Smpl. 1 | 115 nm $TiO_2$ | Smpl. 2 | 121 nm $TiO_2$ | Smpl. 3 | 113 nm $TiO_2$ | Smpl. 4 | 118 nm $TiO_2$ |
|---|---|---|---|---|---|---|---|---|
| a* | −6.6 | 17.17 | −4.1 | −3.5 | −6.6 | 21.3 | −4.2 | 10.4 |
| b* | −9.2 | −41.4 | −12.5 | −38.7 | −7.7 | −40.9 | −12.8 | −40.7 |
| L* | 50.8 | 42.4 | 50.8 | 46.2 | 51.3 | 41.5 | 50.6 | 44.1 |

For this Sample, the presence of the undercoating layer provides a generally lower (more negative) a* and a higher (more positive) b* compared to the article without the undercoating layer.

Example 2

This Example illustrates the use of an undercoating layer of the invention as to provide enhanced photoactivity to a titania topcoat. The undercoating layer comprised silica, titania and phosphorous oxide.

Both the undercoating layer and the top coat (titania) were formed by a chemical vapor deposition process. The precursor for phosphorus oxide was triethyl phosphite (TEP). The precursor for silica was tetraethyl orthosilicate (TEOS). The precursor for titania in both the undercoating layer and the top coat was tetra isopropyl titanate (TPT). Table 3 shows the deposition parameters for Samples 5-9.

TABLE 3

|  | Smpl. 5 | Smpl. 6 | Smpl. 7 | Smpl. 8 | Smpl. 9 |
|---|---|---|---|---|---|
| molar ratio of TEP/TEOS | 1.25 | 1.25 | 0.5 | 0.5 | N/A |
| molar ratio of TPT/TEOS | 0.25 | 0.5 | 0.25 | 0.5 | N/A |
| volume % TEOS of the total flow for the undercoating layer | 0.11 | 0.12 | 0.18 | 0.12 | N/A |
| volume % TEP of the total flow for the undercoating layer | 0.14 | 0.15 | 0.09 | 0.06 | N/A |
| volume % TPT of the total flow for the undercoating layer | 0.03 | 0.06 | 0.05 | 0.06 | N/A |
| volume % TPT of the total flow for the functional coating | 0.257 | 0.257 | 0.257 | 0.257 | 0.257 |

Table 4 shows the layer thicknesses for Samples 5-9.

TABLE 4

|  | Smpl. 5 | Smpl. 6 | Smpl. 7 | Smpl. 8 | Smpl. 9 |
|---|---|---|---|---|---|
| Phosphorus oxide [micrograms/cm$^2$] | 1.5 | 2.1 | 1.5 | 1.2 | N/A |
| Titania [micrograms/cm$^2$] | 34.4 | 38.8 | 36.0 | 37.0 | 30.2 |
| Thickness of the undercoating layer [nm] | 37.4 | 98.9 | 52.5 | 83.3 | 0 |
| Thickness of the titania functional coating [nm] | 132 | 132 | 129 | 121 | 129 |

Table 5 shows the results of a conventional stearic acid test for Samples 5-9. The stearic acid test is described in U.S. Pat. No. 6,027,766, herein incorporated by reference. As can be seen, the articles having the undercoating layer of the invention had higher photocatalytic activity than the articles without the undercoating layer (Sample 9).

TABLE 5

|  | PCA ($\times 10^{-3}$ cm$^{-1}$min$^{-1}$) |
|---|---|
| Smpl. 5 | 121 |
| Smpl. 6 | 121 |
| Smpl. 7 | 112 |
| Smpl. 8 | 92 |
| Smpl. 9 | 61 |

Example 3

This Example illustrates the use of an undercoating layer of the invention to reduce the surface resistance of a fluorine doped tin oxide top coat.

Figure 2:
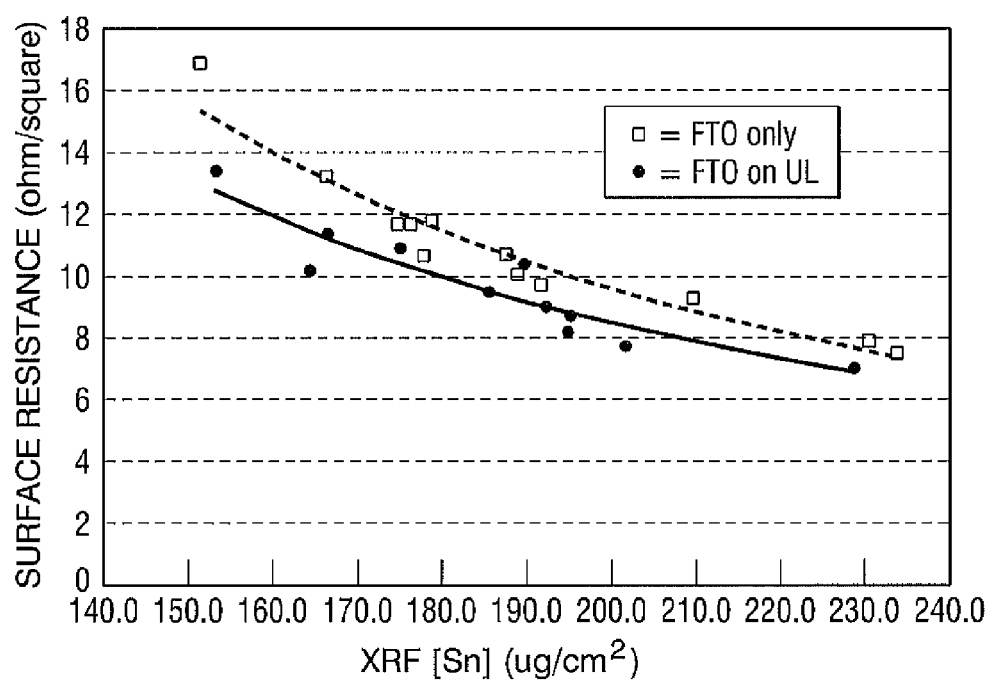
FIG. 2 is a graph of surface resistance versus [Sn] for fluorine doped tin oxide coatings formed directly on glass or on an undercoating of the invention.
Figure 3:
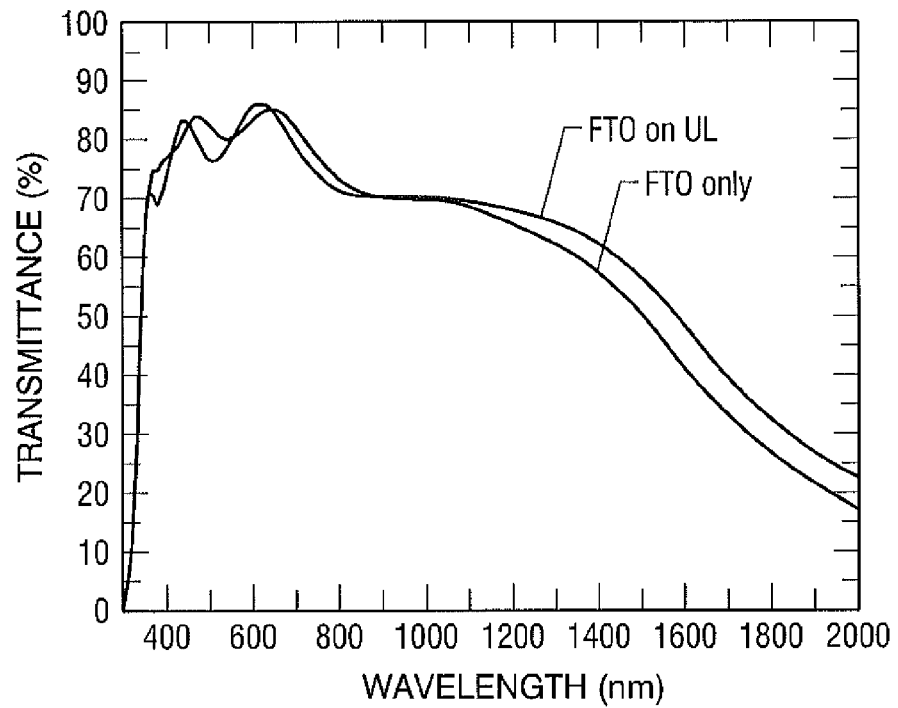
FIG. 3 is a graph of percent transmittance versus wavelength for fluorine doped tin oxide coatings formed directly on glass or on an undercoating of the invention.

The undercoating layer was a silica, titania, phosphorous oxide undercoat deposited by CVD. The precursors used were TEOS (silica), TPT (titania), and TEP (phosphorous oxide). Fluorine doped tin oxide topcoats of various thickness were deposited on the undercoating layer and also on non-coated glass (as comparative samples). Both coatings were compared by surface resistance as measured by R-Chek+4 point meter commercially available from Electronic Design To Market, Inc. The amount of [Sn] was determined by X-ray florescence, which corresponds to the thickness of the fluorine doped tin oxide coatings. FIG. 2 shows that the surface resistance of fluorine doped tin oxide coatings on an undercoating layer of the invention averaged 1 to 3 ohms/square lower than the same thickness fluorine doped tin oxide coatings on glass. In FIG. 2, the open squares and dotted line are for fluorine doped tin oxide on glass. The closed circles and solid line are for the fluorine doped tin oxide coatings on the undercoating layer of the invention. The undercoating layer (composition and thickness) was the same for each sample.

Example 4

A piece of clear glass (12 inches by 24 inches; 30 cm by 61 cm) was coated using a CVD process with the precursors described above. Half of the glass was coated with a fluorine doped tin oxide coating directly on the glass and the other half of the glass was coated with a silica, titania, phosphorous undercoating layer and a fluorine doped tin oxide top coat. Samples were cut from each portion of the glass sheet and analyzed as described below.

(1) X-Ray Fluorescence (XRF) Data

The XRF data in Table 6 show a similar amount of [Sn] for both coatings (slightly higher in the case of the FTO/UL coating stack).

TABLE 6

|      | FTO only | FTO/UL | Blank |
|------|----------|--------|-------|
| [P]  | 0.09     | 0.56   | 0.09  |
| [Ti] | 0        | 1.87   | 0     |
| [Sn] | 145.8    | 147    | 0.2   |

(2) Haze and Transmittance

Figure 4:
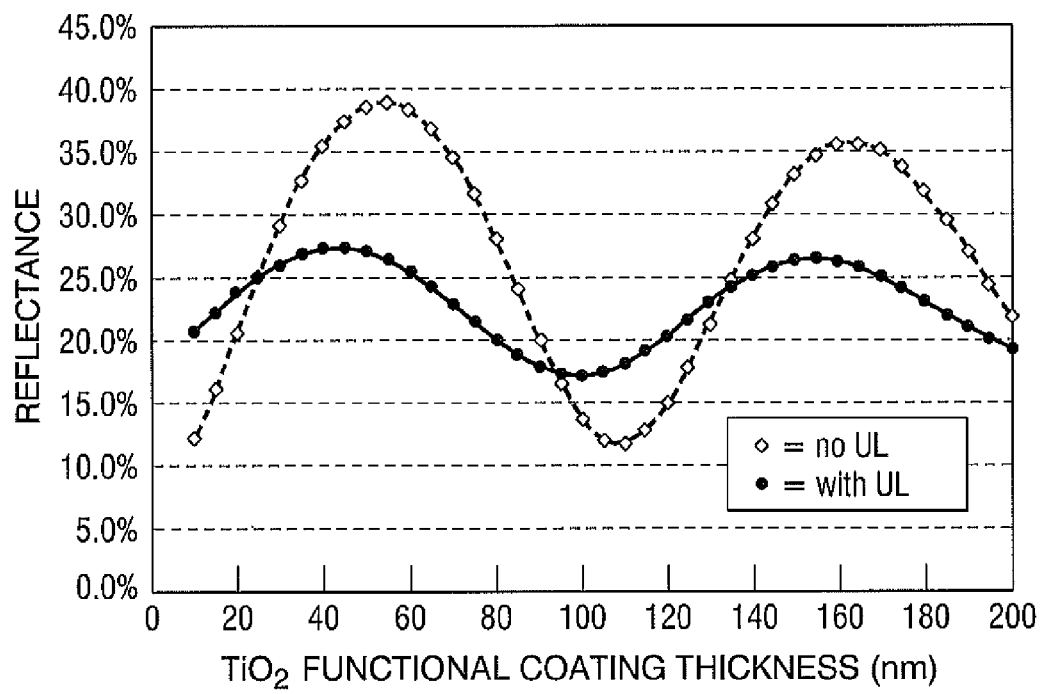
FIG. 4. is a graph of reflectance versus titania thickness for the coated articles of Example 5.

The Samples were also tested for haze and transmittance. The results are shown in Table 7. The transmittance spectra are shown in FIG. 4. The haze was higher and the transmittance was also higher for the fluorine doped tin oxide (FTO)/undercoating layer (UL) coating stack as compared to the fluorine doped tin oxide (FTO) coating directly on glass. Thus, the undercoating layer of the invention also provides a way to increase the haze and transmittance of a coated article. This could be useful in the field of solar cells where increased haze increases the absorption path of the electromagnetic energy which, in turn, provides increased opportunity for the electromagnetic energy to be absorbed.

TABLE 7

|               | FTO only | FTO/UL |
|---------------|----------|--------|
| Haze          | 0.89%    | 1.77%  |
| Transmittance | 80.78%   | 81.37% |

(3) Surface Resistance

Surface resistance data are shown in Table 8. The FTO/UL coating had a surface resistance 1.5 ohm/sq lower than that of FTO coating on glass.

TABLE 8

| FTO only     | FTO/UL       |
|--------------|--------------|
| 13.55 ohm/sq | 12.05 ohm/sq |

(4) Coating Thickness

The FTO coating thickness was slightly higher in the case of the FTO coating on glass (356 nm) versus the FTO on the UL (FTO top coating 334 nm) as determined by the etching method.

(5) Coating Porosity

The coatings were viewed using scanning electron microscopy (SEM). Numerous small holes were seen in the FTO coating directly on glass. No holes were observed in the FTO/UL coating stack.

(6) Surface Roughness

Surface roughness was analyzed using atomic force microscopy (AFM) for areas of 10 micrometers (um) by 10 um; 5 um by 5 um; and 1 um by 1 um. The results are shown in Table 9. The surface roughness was higher in the case of the FTO/UL coating stack than for the FTO directly on glass. Increased surface roughness increases the coating haze and, therefore, increases the absorption path of any impinging electromagnetic energy.

TABLE 9

| Sample              | RMS Roughness (nm) | Ra Roughness (nm) |
|---------------------|--------------------|--------------------|
| FTO only 10 um × 10 um | 13.39           | 10.69             |
| FTO/UL 10 um × 10 um   | 17.45           | 13.74             |
| FTO only 5 um × 5 um   | 12.53           | 9.99              |
| FTO/UL 5 um × 5 um     | 18.03           | 14.09             |
| FTO only 1 um × 1 um   | 8.99            | 7.18              |
| FTO/UL 1 um × 1 um     | 9.96            | 8.03              |

Example 5

This Example illustrates the effect of an undercoating layer of the invention on the reflectance of a coated article.

FIG. 4 shows the change of reflectance for a 10 nm to 120 nm $TiO_2$ coating on clear glass (open diamond with dotted line) and for the same $TiO_2$ layer on an undercoating layer of the invention on clear glass. The undercoating layer was 13 nm 75% $SiO_2$-20% $TiO_2$-5% $P_2O_5$/23 nm 49% $SiO_2$-49% $TiO_2$-2% $P_2O_5$/21 nm 75% $SiO_2$-20% $TiO_2$-5% $P_2O_5$ (closed circle and solid line). The change of $TiO_2$ thickness is from 10 nm to 120 nm with 5 nm intervals.

FIG. 4 shows that when the $TiO_2$ functional coating thickness on glass increases, the reflectance swings widely (i.e., anywhere from 11.7%<R<38.8%). However, when the $TiO_2$ functional coating is deposited on the undercoating layer, the reflectance changes are much lower (i.e., ranging from 17.2% to 27.4%). This shows that with the variation of top coating thickness, the reflectance of the entire coating stack with an underlayer coating is not as sensitive as that without an underlayer coating.

In some regions, the reflectance could be significantly reduced with an undercoating layer of the invention. Table 10 shows the difference in reflectance at titania levels of 55 nm and 165 nm.

TABLE 12

|  |  | PCA (×10$^{-3}$ cm$^{-1}$) | [Ti] amount by XRF (□g/cm$^2$) | | |
|---|---|---|---|---|---|
|  |  | min$^{-1}$ | [Ti]$_{underlayer}$ | [Ti]$_{underlayer + topcoat}$ | [Ti]$_{topcoat}$ |
| Sample 12 | TiO$_2$ coating on Sample 10 | 56.5 | 4.10 | 34.60 | 30.50 |
| Sample 13 | TiO$_2$ coating on Sample 11 | 57.7 | 4.60 | 35.40 | 30.80 |
| Sample 14 | TiO$_2$ coating on clear glass | 51.6 | N/A | 32.70 | 32.70 |

TABLE 10

|  | Reflectance Without Underlayer | Reflectance With Underlayer |
|---|---|---|
| 55 nm TiO$_2$ | 38.8% | 26.4% |
| 165 nm TiO$_2$ | 35.6% | 25.5% |

Example 6

This Example illustrates the effect of an undercoating layer of the invention on the color (e.g., a* and b*) of an article.

Figure 5:
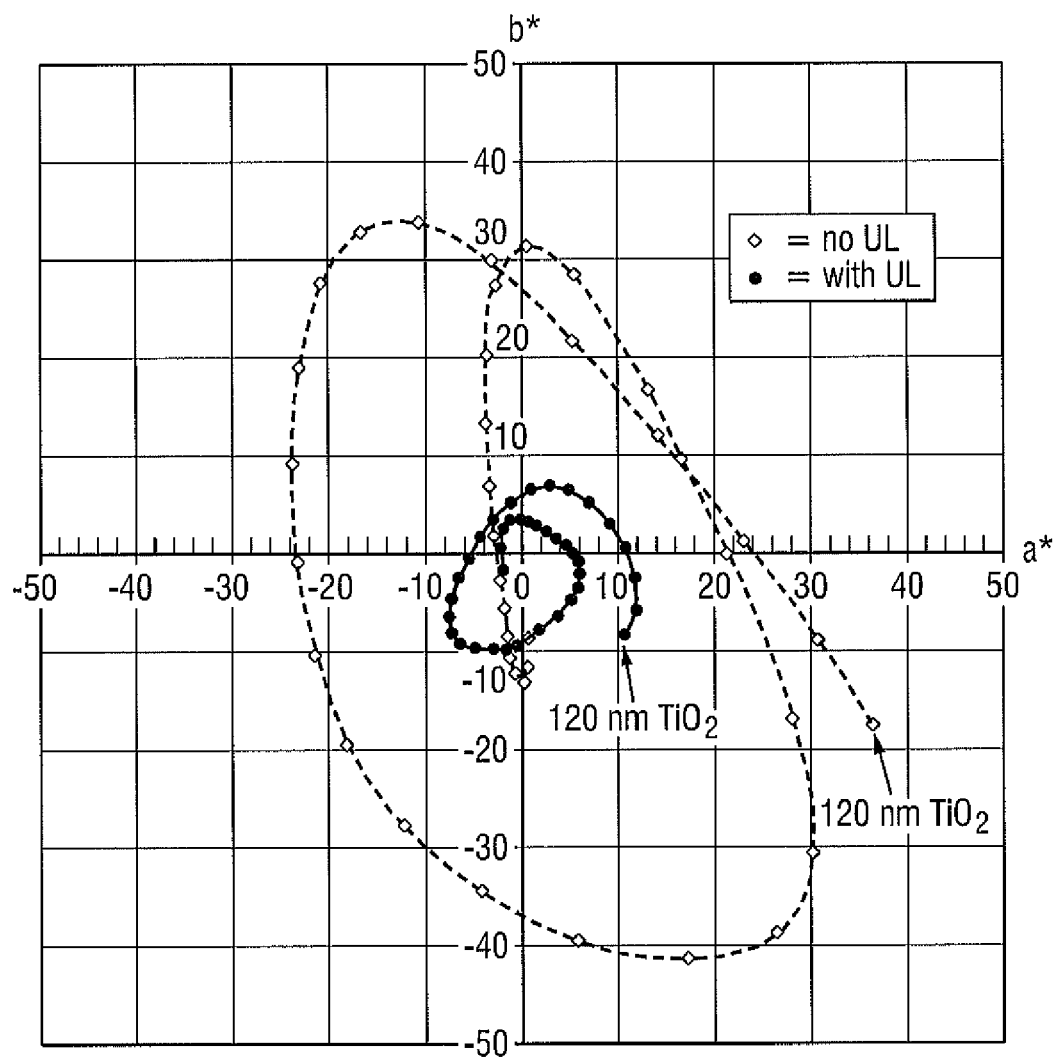
FIG. 5 is a graph of color change for the coated articles of Example 6.

FIG. 5 shows the change of a* and b* for a 10 nm to 120 nm TiO$_2$ on clear glass (open diamond with dotted line) and for the same coating on an undercoating layer (13 nm 75% SiO$_2$-20% TiO$_2$-5% P$_2$O$_5$/23 nm 49% SiO$_2$-49% TiO$_2$-2% P$_2$O$_5$/21 nm 75% SiO$_2$-20% TiO$_2$-5% P$_2$O$_5$) on clear glass (closed circle and solid line). The change of TiO$_2$ thickness is from 10 nm to 120 nm with 5 nm intervals.

FIG. 5 shows that when the TiO$_2$ functional coating thickness increases, the color (a* and b*) of the TiO$_2$ coating without the underlayer swings widely (anywhere from −24<a*<+37, and −42<b*<+34). However, when the TiO$_2$ functional coating is deposited on an undercoating layer as described above, the a* and b* only change less (ranging from −8<a*<+12, and −10<b*<+7). This means that with the variation of top coating thickness, the color of the entire coating stack with an underlayer coating layer of the invention is not as sensitive as that without an undercoating layer.

Example 7

This Example illustrates the effect of a gradient undercoating layer of silica and titania on the photocatalytic activity of a titania topcoat (120 nm thick).

Table 11 shows the compositions of two gradient undercoating layers.

TABLE 11

|  | Average TiO$_2$ (%) | Average SiO$_2$ (%) | Estimated thickness (nm) | XRD result | a* | b* | R (%) |
|---|---|---|---|---|---|---|---|
| Sample 10 | 68.9 | 31.1 | 23 | Amorphous | −0.937 | −8.174 | 14.51 |
| Sample 11 | 68.1 | 31.9 | 32 | Amorphous | −1.129 | −7.904 | 15.81 |

Table 12 shows the effect of the two undercoating layers of Table 11 on the photocatalytic activity of a 120 nm thick topcoat of titania as compared to the activity of the titania without the undercoating layers.

It will be readily appreciated by those skilled in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. A coated article, comprising:
    a substrate;
    a first coating formed over at least a portion of the substrate, the first coating comprising at least two oxides selected from the group consisting of oxides of P, Si, Ti, Al and Zr; and
    a functional coating formed over at least a portion of the first coating,
    wherein the first coating is a multi-layer coating comprising:
    a first layer comprising phosphorous oxide, silica, and titania, with titania present in the range of 10-25 volume %;
    a second layer comprising phosphorous oxide, silica, and titania, with titania present in the range of 36-50 volume %; and
    a third layer comprising phosphorous oxide, silica, and titania, with titania present in the range of 9-25 volume %.

2. The article of claim 1, wherein the first coating further comprises an oxide of Al.

3. The article of claim 1, wherein the functional coating comprises at least one oxide selected from the group consisting of oxides of Ti, Zn, Fe, Mn, Al, Ce, Sn, Sb, Hf, Zr, Ni, Zn, Bi, Ti, Co, Cr, Si, In, and an alloy of two or more of these materials.

4. The article of claim 3, wherein the functional coating comprises at least one dopant selected from F, In, Al and Sb.

5. The article of claim 4, wherein the functional coating comprises fluorine doped tin oxide.

6. The article of claim 4, wherein the functional coating comprises titania.

7. The article of claim 6, wherein the titania has a thickness in the range of 113 nm to 121 nm.

8. The article of claim 1, wherein the article has a color in the range of $-10 \leq a^* \leq 2$ and $-15 \leq b^* \leq 0$.

9. The article of claim 8, wherein the article has an $a^*$ in the range of $-8$ to $-4.4$, a $b^*$ in the range of $-12.6$ to $-5.2$, and an $L^*$ in the range of 50.5 to 52.3.

10. A coated article, comprising:
a substrate;
a first coating formed over at least a portion of the substrate, the first coating comprising oxides of at least two of P, Si, Ti, Al and Zr; and
a functional coating formed over at least a portion of the first coating,
wherein the first coating is a multi-layer coating comprising:
a first layer comprising 5-10 volume % phosphorous oxide, 70-80 volume % silica and 10-25 volume % titania with a thickness in the range of 11 nm to 29 nm;
a second layer comprising 2 volume % phosphorous oxide, 48-62 volume % silica and 36-50 volume % titania with a thickness in the range of 21 nm to 33 nm; and
a third layer comprising 5-11 volume % phosphorous oxide, 70-80 volume % silica and 9-25 volume % titania with a thickness in the range of 15 nm to 23 nm.

11. A coated article, comprising:
a glass substrate;
a first coating formed over at least a portion of the substrate, the first coating comprising at least two oxides selected from the group consisting of oxides of P, Si, Ti, Al and Zr; and
a functional coating formed over at least a portion of the first coating, the functional coating comprising an oxide selected from the group consisting of titania and fluorine doped tin oxide,
wherein the first coating is a multi-layer coating comprising,
a first layer comprising phosphorous oxide, silica, and titania, with silica present in the range of 70-80 volume %;
a second layer comprising phosphorous oxide, silica, and titania, with silica present in the range of 48-62 volume %; and
a third layer comprising phosphorous oxide, silica, and titania, with silica present in the range of 70-80 volume %.

* * * * *